(12) United States Patent
Martin

(10) Patent No.: US 7,847,735 B2
(45) Date of Patent: Dec. 7, 2010

(54) INTEGRATED PHOTOVOLTAIC CELL AND ANTENNA

(75) Inventor: Robert T. Martin, Cupertino, CA (US)

(73) Assignee: Avago Technologies General IP (Singapore) Pte. Ltd., Singapore (SG)

( * ) Notice: Subject to any disclaimer, the term of this patent is extended or adjusted under 35 U.S.C. 154(b) by 1429 days.

(21) Appl. No.: 11/118,557

(22) Filed: Apr. 29, 2005

(65) Prior Publication Data

US 2010/0008052 A1      Jan. 14, 2010

(51) Int. Cl.
*H01Q 1/38* (2006.01)
(52) U.S. Cl. .................. 343/700 MS; 343/702
(58) Field of Classification Search ........... 343/700 MS, 343/702
See application file for complete search history.

(56) References Cited

U.S. PATENT DOCUMENTS

| | | | | |
|---|---|---|---|---|
| 5,484,997 A | * | 1/1996 | Haynes | 235/492 |
| 5,986,609 A | * | 11/1999 | Spall | 343/702 |
| 6,278,884 B1 | * | 8/2001 | Kim | 455/556.1 |
| 6,980,777 B2 | * | 12/2005 | Shepherd et al. | 455/90.3 |
| 7,030,411 B2 | * | 4/2006 | Krulevitch et al. | 257/57 |
| 7,129,493 B2 | * | 10/2006 | Garner et al. | 250/347 |
| 2002/0022494 A1 | * | 2/2002 | Brand et al. | 455/517 |
| 2004/0196182 A1 | * | 10/2004 | Unnold | 342/357.07 |
| 2004/0239567 A1 | * | 12/2004 | Van Der Poel | 343/700 MS |
| 2005/0008061 A1 | * | 1/2005 | Kaneko | 374/16 |
| 2005/0151215 A1 | * | 7/2005 | Hauhe et al. | 257/421 |
| 2006/0130889 A1 | * | 6/2006 | Li et al. | 136/244 |

FOREIGN PATENT DOCUMENTS

| | | | |
|---|---|---|---|
| GB | EP000982795 A1 | * | 9/2000 |
| JP | 10242443 A | * | 9/1998 |
| JP | 2001267836 A | * | 9/2001 |
| JP | 2001-320128 | * | 11/2001 |

* cited by examiner

*Primary Examiner*—Douglas W Owens
*Assistant Examiner*—Dieu Hien T Duong

(57) ABSTRACT

RF device powered by photovoltaic cells. A device comprises a substrate having one or more photovoltaic cells mounted on one side of the substrate, and an RF antenna mounted on the other side of the substrate. Electronics powered by the photovoltaic cells and communicating via the RF antenna are preferably mounted on the same side of the substrate as the antenna, but may be mounted on the same side of the substrate as the photovoltaic cells.

18 Claims, 2 Drawing Sheets

INTEGRATED PHOTOVOLTAIC CELL AND ANTENNA

TECHNICAL FIELD

Embodiments in accordance with the invention are related to instrumentalities powered by photovoltaic cells and communicating via radio frequency (RF) antennas.

BACKGROUND

The evolution of modern electronics enables complex circuitry to be reduced to increasingly miniaturized, packing increasingly larger numbers of active devices into a square millimeter. Just as miniaturization is bound by physical laws, so are other aspects controlling how small devices may be made.

Two key areas affecting device miniaturization involve communications with other devices, and powering the device itself. Micropower digital and analog circuit design enables devices to be powered by photovoltaic cells covering a few square centimeters.

As much as designers would like to shrink the size of a device, physical laws still require that for efficient radio frequency (RF) communications, the size of an antenna is related to the wavelength of interest. As an example, many antenna designs require elements on the order of a quarter wavelength of the operating frequency.

SUMMARY OF THE INVENTION

An electronic device comprises a substrate having one or more photovoltaic cells mounted to one side of the substrate, and an RF antenna on the other side of the substrate. Circuitry powered by the photovoltaic cells and communicating via the RF antenna is preferably mounted to the same side of the substrate as the antenna, but may be mounted on the same side of the substrate as the photovoltaic cells. The device may also support sensors.

DETAILED DESCRIPTION

Figure 1:
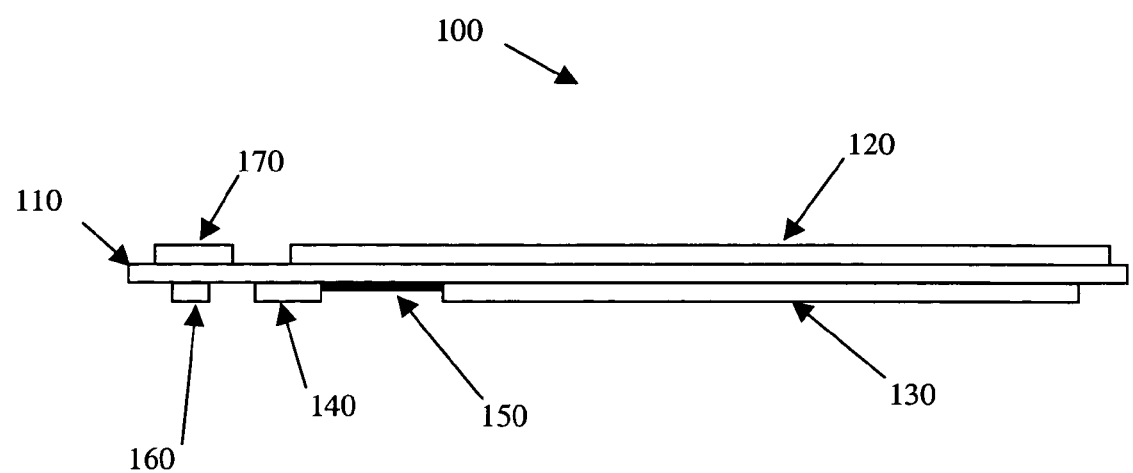
FIG. 1 shows a side view of a device integrating PV cells and an antenna.

Referring to FIG. 1, a side view of a device according to the present invention is shown. Device 100 comprises substrate 110 to which photovoltaic cells 120 are attached. Substrate 110 may be a standard fiberglass substrate (FR4) used in printed circuit board manufacturing, a flexible substrate such as Kapton from Dupont or other polyimide materials available from suppliers such as 3M and Gould Electronics depending on the flexibility of other elements, particularly photovoltaic cells 120 and antenna 130. A low-loss material such as Duroid from Rogers Corporation, or other PTFE materials, or other substrate materials known to the printed circuit arts may be used. Polyimide and PTFE substrates may provide more stability when compared to fiberglass over environmental variations such as temperature and humidity.

Photovoltaic cells 120 provide operating power for the device. For micropower devices, a series-connected array of photovoltaic cells covering an area of eight or more square centimeters is adequate. Depending on the amount of power required for the device, the anticipated strength of illumination available, and the efficiency of the photovoltaic cells used, areas on the order of eight to 40 square centimeters or more are anticipated. As will be discussed, the minimum size available may be set by dimensions required for antenna efficiency.

Attached to the opposite side of substrate 110 is antenna structure 120. The size of the antenna depends on the operating frequency and antenna type. Typical operating frequencies of interest include the 915-928 MHz band used by devices falling under United States Federal Communications Commission Part 15 rules including some Zigbee implementations, the 2.4 GHz band used by IEEE 802.15.4 Zigbee, Bluetooth, and some IEEE 802.11 communications protocols, the 5 GHz band also used by some 802.11 protocols, and the 1575 MHz band used by civilian GPS.

As an example demonstrating antenna size, a rectangular patch antenna for the 1575 MHz GPS frequency, when manufactured on standard FR4 fiberglass circuit board material, is approximately 5.75 by 4.5 centimeters in size. A round antenna for this frequency, again using FR4 materials, is approximately 5.3 centimeters in diameter.

For the 2.4 GHz band used by Bluetooth, 802.15.4 Zigbee, and 802.11a and 802.11g, a quarter wavelength element fabricated on FR4 is approximately 17 millimeters in length. Common antenna structures for this band vary in size and complexity, covering areas up to about 4 centimeters on a side.

It should be noted that the properties of the substrate material, particularly the dielectric constant ($E_r$) and its stability over expected environmental variations, play an important role in design and fabrication of antenna structures and transmission lines at the operating frequencies mentioned; altering the thickness or type of substrate will most likely change the dimensions of these frequency-dependent circuit elements. Some antenna and transmission line structures require a ground or reference plane. This may be provided through the construction of the photovoltaic array, or other conductive layers on the substrate, or internal conductive layers in the substrate as are used in multi-layer printed circuit boards.

Figure 2:
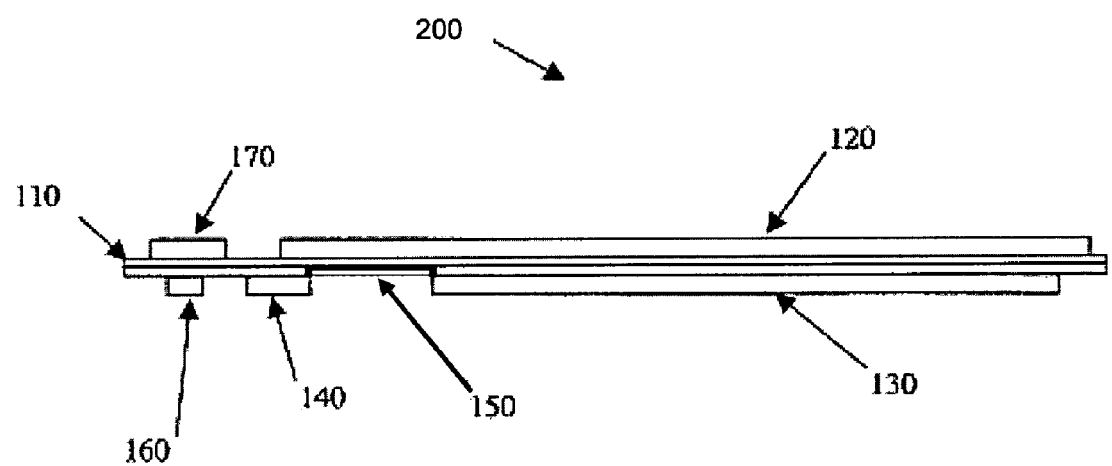
FIG. 2 shows a side view of another device integrating PV cells and an antenna.

Antenna 130 is driven by circuit element 140 through transmission line 150. Circuit element 140 is typically a mixed analog and digital device, powered by photovoltaic cells 120. As an example, integrated circuits for Zigbee communications are available from companies such as Atmel, Motorola, Mitsubishi, and Philips. Integrated circuits for Bluetooth are available from companies such as Texas Instruments, Infineon, Intel, Toshiba, and Broadcom Corporation. Filter capacitors (not shown) may be used to smooth out-ripple. When physical size is a premium, 114 tantalum capacitors are appropriate. If physical space and size constraints permit, large value capacitors, such as the 1 Farad devices available from Panasonic may be used to provide energy storage. Circuit element 140 connects to antenna 130 via transmission line 150. As is known to the art, transmission line 150 must be designed to provide the proper characteristic impedance to both antenna 130 and the RF sections of device 140 to achieve best performance. While transmission line 150 is shown as a circuit element on the surface of substrate 110, it may 25 also be present as an internal layer of a multi-layer printed circuit substrate as shown in device 200 of FIG. 2. This would be appropriate for example when a patch design is used for antenna 130; the feed point of such a patch antenna would be through a conductive via to a transmission line in an internal conductive layer of substrate 100. While FIG. 1 shows circuit element 140 on the same side of the substrate as antenna 130, it may be mounted on the opposite side of the substrate, along with photovoltaic cells 120.

FIG. 1 also shows optional elements 160 and 170, which may be sensors or additional logic. In some implementations it may be desirable to separate functionality into separate digital and RF blocks. Sensors and/or additional logic elements may be mounted on either side of the substrate, communicating electrically through vias and conductive traces as is known in the printed circuit arts. Sensors deployed on such a device are limited mainly by power consumption, which may be reduced by operating sensors and other circuitry at low duty cycles when possible. Sensors may include environmental sensors such as temperature and humidity, or image and motion sensors using CMOS imaging arrays.

The invention claimed is:

1. An electronic device comprising:
   a substrate having a first side and a second side,
   one or more photovoltaic cells mounted on the first side of the substrate,
   an RF antenna mounted on the second side of the substrate, and
   at least one integrated circuit mounted on the substrate powered by the photovoltaic cells and connected to the RF antenna,
   wherein at least one of the photovoltaic cells provides a ground plane for the RF antenna.

2. The device of claim 1, further comprising a transmission line connecting the integrated circuit to the RF antenna, wherein the transmission line is provided on the second side of the substrate.

3. The device of claim 1, wherein the substrate is a multi-layer substrate having internal conductive layers.

4. An electronic device comprising:
   a substrate having a first side and a second side,
   one or more photovoltaic cells mounted on the first side of the substrate,
   an RF antenna mounted on the second side of the substrate,
   at least one integrated circuit mounted on the substrate powered by the photovoltaic cells and connected to the RF antenna; and
   a transmission line connecting the integrated circuit to the RF antenna, wherein the substrate is a multi-layer substrate and wherein the transmission line is provided in an internal layer of the multi-layer substrate.

5. The device of claim 4 where the electronic integrated circuit is mounted on the first side of the substrate.

6. The device of claim 4 where the antenna operates in at least one of the 2.5 GHz band, the 5.4 GHz band, the 928 MHz band and the 1575 MHz frequency band.

7. The device of claim 4 further including one or more sensors connected to the integrated circuit.

8. The device of claim 7 where one or more of the sensors are mounted on the first side of the substrate.

9. The device of claim 7 where one or more of the sensors are mounted on the second side of the substrate.

10. The device of claim 7 where the sensors include a temperature sensor.

11. The device of claim 7 where the sensors include a humidity sensor.

12. The device of claim 7 where the sensors include an imaging sensor.

13. The device of claim 7 where the sensors include a motion sensor.

14. The device of claim 4 where the integrated circuit and RF antenna operate in accordance with 802.11 standards.

15. The device of claim 4 where the integrated circuit and RF antenna operate in accordance with Bluetooth standards.

16. The device of claim 4 where the integrated circuit and RF antenna operate in accordance with 802.15.4 Zigbee standards.

17. The device of claim 4, wherein the substrate is a dielectric substrate comprising one of a fiberglass substrate, a polyimide substrate and a polytetrafluoroethylene (PTFE) substrate.

18. The device of claim 4, wherein the integrated circuit is mounted on the second side of the substrate.

* * * * *